April 22, 1969 P. J. COPPEN 3,440,500

HIGH FREQUENCY FIELD EFFECT TRANSISTOR

Filed Sept. 26, 1966

INVENTOR.
PETER J. COPPEN
BY Arthur L. Leisler
ATTORNEY

United States Patent Office 3,440,500
Patented Apr. 22, 1969

3,440,500

HIGH FREQUENCY FIELD EFFECT TRANSISTOR

Peter J. Coppen, Sunnyvale, Calif., assignor to International Telephone and Telegraph Corporation, Nutley, N.J., a corporation of Maryland Filed Sept. 26, 1966, Ser. No. 581,949
Int. Cl. H01l 11/14
U.S. Cl. 317—235 7 Claims

ABSTRACT OF THE DISCLOSURE

This is a field effect transistor which provides for improved high frequency response by eliminating the external lead inductance normally associated with the device when the source region is grounded. This is accomplished by placing the low resistive portion of a body on a conductive substrate which can be directly connected to ground. The source and drain regions of the device are formed within the high resistive portion of the body, said high resistive portion being disposed on said low resistive portion. A low resistive contact region is inset into the high resistive portion and extends into the low resistive portion. Thus when a metallic surface layer electrically shorts the surface portion of the contact and source regions, the source is electrically connected to the conductive substrate thereby providing a direct ground connection for the source region.

This invention relates to an improved field effect transistor, and more particularly to such a transistor having improved high frequency performance.

Field effect transistors in use today generally comprise a body of semiconductor material having spaced source and drain regions therein, with a gate electrode coupled to the space or "channel" between said regions for modulating the current flow therebetween. In the high frequency operation of such field effect transistors, a common technique is to ground the semiconductor body as well as the source region. The body is generally grounded by physically attaching the semiconductor to a metallic substrate, usually a header. The source is generally grounded either (i) internally by a wire extending from the source region to the header, or (ii) externally by a wire connecting the source region to an insulated terminal lead extending through the header. When either of these techniques is employed, the wire connected to the source region exhibits sufficient inductance, at the high frequencies at which the device is operated, to introduce substantial series impedance thereby contributing to deteriorated performance at these frequencies.

Accordingly, an object of the present invention is to provide an improved field effect transistor.

Another object of the invention is to provide a field effect transistor having improved high frequency performance, by reducing the series impedance exhibited between the transistor and any external circuitry connected thereto.

These, and other objects which will become apparent by reference to the following description taken in conjunction with the accompanying drawings and appended claims, are realized by eliminating the wire connection to the source region of the transistor, and substituting a low impedance diffused region electrically connecting said source region to the semiconductor.

The invention will be best understood by reference to the following detailed description and the drawings, in which.

Figures 1, 2, 3:
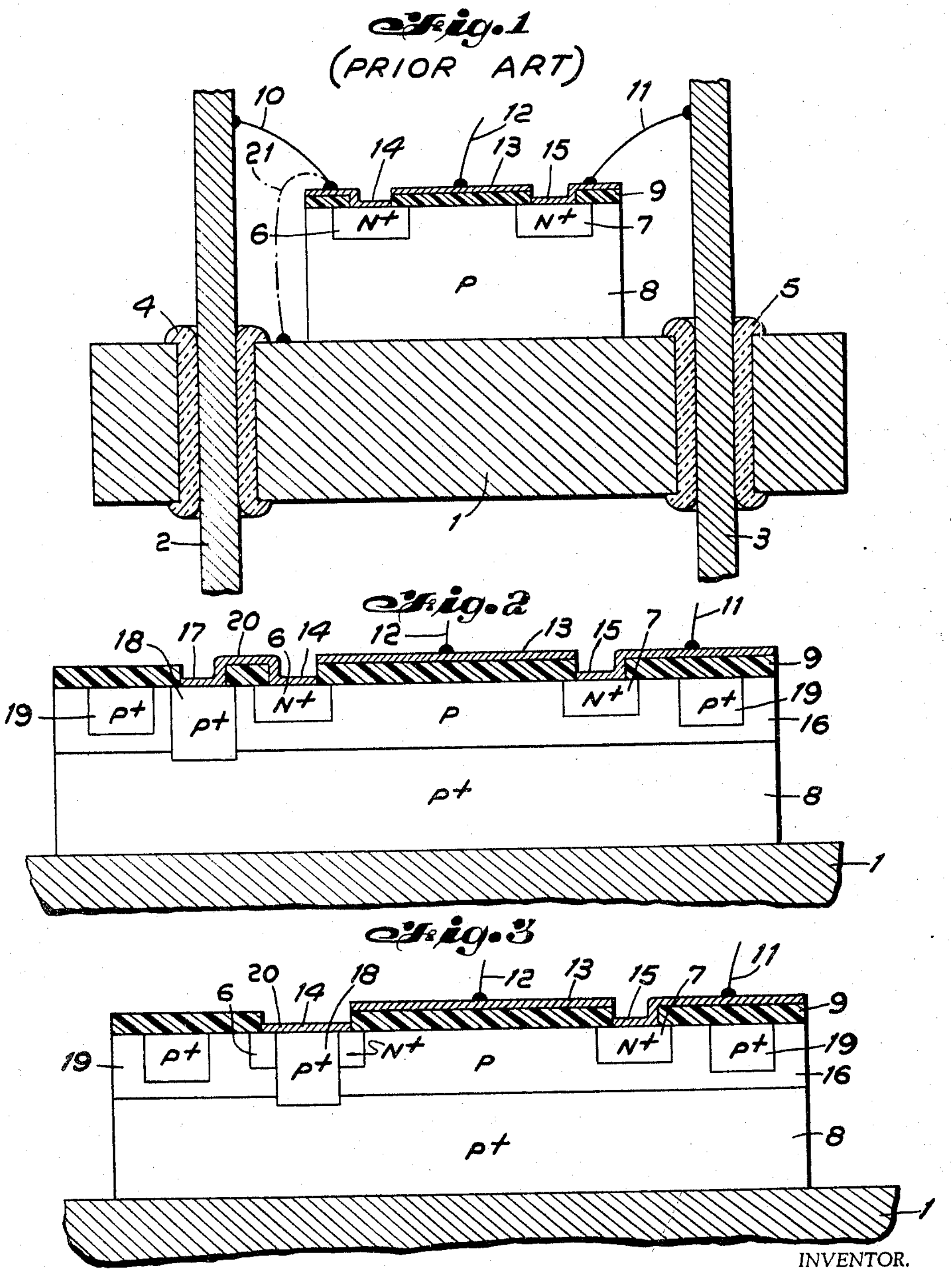
FIGURE 1 shows a field effect transistor according to the prior art.
FIGURE 2 shows an improved high frequency field effect transistor according to the invention.
FIGURE 3 shows an alternative embodiment of the invention.

In FIGURE 1, the semiconductor body 8 is mounted on a metallic header 1 and electrically connected thereto, e.g., by a solder connection. Conductive terminal leads 2 and 3 extend through the header and are insulated therefrom by glass seals 4 and 5.

The semiconductor body 8 which may, e.g., be of P-type conductivity (the conductivity types of the various semiconductor regions are set forth herein by way of example only, it being understood that similar devices may be manufactured having all conductivity types inverted from those set forth), contains a source region 6 and a drain region 7, both of N+ type conductivity. A layer of insulating material 9 is disposed on a given surface of the body 8 and has apertures therein exposing parts of the source and drain regions. Metallic layers 14 and 15 are disposed on the insulating layer 9 and contact the source and drain regions 6 and 7 respectively. Connecting wires 10 and 11 interconnect the source region 6 with the terminal lead 2 and the drain region 7 with the terminal lead 3. A metallic layer 13 serving as the gate electrode is disposed on the insulating layer 9 adjacent the space between the source and drain regions. A connecting wire 12 is electrically connected between the gate electrode 13 and a third terminal (not shown) extending through and insulated from the header 1.

In some field effect transistors presently employed, the source region 6 is directly connected to the header 1 by a connecting wire 21. However, regardless of whether the connecting wire 10 or 21 is employed, the self-inductance exhibited by said wire introduces substantial inductive reactance in series with the source region at high frequencies, thus substantially deteriorating performance of the transistor at these frequencies.

A field effect transistor according to a preferred embodiment of the invention is shown in FIGURE 2. The transistor comprises a semiconductor body 8 disposed on and soldered to a conductive header 1. The header 1 should preferably comprise a material exhibiting good electrical and thermal conductivity, such as copper or silver. The semiconductor body 8 may, e.g., consist of silicon of P-type conductivity. As shown in FIGURE 2, the semiconductor body 8 is of low resistivity P+ type conductivity in order to provide low spreading resistance between the header and the active portion of said body comprising the epitaxial P-type layer 16. Formed in the P-type silicon epitaxial layer 16 are diffused source and drain regions 6 and 7 respectively, and an annular guard ring 19 of P+ type conductivity. The guard ring 19 surrounds the active regions of the transistor and serves to reduce channeling effects due to undesired inversion of conductivity type at the semiconductor surface.

A contact region 18 of P+ type conductivity is diffused entirely through the epitaxial layer 16 to the underlying P+ portion of the semiconductor body 8 to form an ohmic contact with said body. The exposed surface of epitaxial layer 16 is covered by an insulating layer 9, which may comprise, e.g., silicon dioxide, said insulating layer having apertures 14, 15 and 17 therein exposing parts of the source, drain and contact regions. A metallic layer 20 interconnects the source region 6 and the contact region 18. An additional metallic layer 15 makes electrical connection to the drain region 7, and a third metallic layer 13 serves as the gate electrode of the transistor. When a suitable positive control voltage is applied to the gate electrode 13, a thin surface region of N+ conductivity type will be induced in the epitaxial layer 16 adjacent the gate electrode, thus establishing continuity between source region 6 and drain region 7. Varying the potential applied to gate electrode 13 varies the effective conductivity between the source and drain regions, thus modulating any current flowing therebetween.

Connecting wires 11 and 12 establish electrical connection between the drain region and gate electrode and corresponding terminal leads (not shown) extending through the header 1 and insulated therefrom. The source region 6 is directly electrically connected to the body 8 of the transistor by the low impedance connection comprising metallic layer 20 and contact region 18, thus eliminating the series inductance inherent in the source connections of field effect transistors heretofore known.

A particular advantage of field effect transistors constructed in accordance with the invention is that the contact area 18 may be formed during the same diffusion operation which forms the guard ring 19 and may, if desired, be formed as an integral part of said guard ring; provided that the guard ring is diffused right through the epitaxial layer 16.

FIGURE 3 shows a space-saving alternative embodiment of the invention, wherein the contact area 18 is disposed within the source region 6. The metallic layer 20 is disposed over the interface between the source region 6 and contact region 18, and therefore electrically interconnects these regions.

It should be noted that the contact region 18 need not necessarily penetrate entirely through the epitaxial layer 16. Rather, it is sufficient if the contact region penetrates sufficiently far through the epitaxial layer to reduce the source to body spreading resistance to an acceptable value.

The various regions described above can be readily fabricated in accordance with well known selective diffusion techniques. The silicon dioxide insulating layer 9 may be either thermally grown or pyrolytically deposited, and the apertures 14, 15 and 17 therein created by well known photoetching methods. In addition, dielectric layers such as silicon nitride, amorphous silicon, or any other material with suitable electrical properties may be used in place of the silicon dioxide. The various metallic layers may, e.g., comprise aluminum and be vacuum evaporated and subsequently photoetched to form the patterns required. Other contact metals, common in the transistor art, may be used. The epitaxial layer 16 preferably has a resistivity substantially greater than the resistivity of the underlying semiconductor body 8, which may be doped practically to the point of degeneracy in order to provide minimal spreading resistance between the epitaxial layer 16 and the transistor header 1.

While the principles of the invention have been described above in connection with specific embodiments, and particular modifications thereof, it is to be clearly understood that this description is made only by way of example and not as a limitation on the scope of the invention.

What is claimed is:

1. An improved field effect transistor comprising:

a conductive substrate;

a body of semiconductor material having a first portion of one conductivity type and a first resistivity, said first portion being disposed on and electrically connected to said substrate, said body having a second portion of said one conductivity type and substantially higher resistivity than said first portion, said second portion being disposed on said first portion, said second portion having spaced source and drain regions of opposite conductivity type inset into and surrounded by said second portion, each of said regions being contiguous with a given surface of said second portion and forming a P-N junction with said second portion;

a contact region of said one conductivity type and said first resistivity contiguous with said given surface, said contact region being inset into said second portion adjacent a selected one of said source and drain regions and extends into said first portion;

a layer of insulating material disposed on said given surface, said layer having apertures therein exposing at least a part of each of said source, drain and contact regions;

a metallic layer adjacent said given surface electrically interconnecting said selected region and said contact region thereby electrically connecting said selected region to said conductive substrate;

a gate electrode disposed on said insulating layer adjacent the space between said source and drain regions; and an electric contact to the other of said source and drain regions.

2. A transistor according to claim 1, wherein said substrate comprises a header having first and second terminal leads extending therethrough and insulated therefrom, said first lead being electrically connected to said other region and said second lead being electrically connected to said gate electrode.

3. A transistor according to claim 1, wherein said second portion comprises an epitaxial layer disposed on said first portion.

4. A transistor according to claim 1, wherein said contact region is disposed within said selected region and is contiguous with said selected region.

5. A transistor according to claim 4, wherein said metallic layer is disposed over at least a part of the interface between said selected region and said contact region.

6. A transistor according to claim 5, wherein said selected region is said source region.

7. A transistor according to claim 1, wherein said selected region is said source region.

| | | | |
|---|---|---|---|
| 3,136,897 | 6/1964 | Kaufman | 317—235 |
| 3,209,214 | 9/1965 | Murphy et al. | 317—235 |
| 3,253,197 | 5/1966 | Haas | 317—235 |
| 3,275,911 | 9/1966 | Onodera | 317—235 |
| 3,296,462 | 1/1967 | Reddi | 317—235 |
| 3,315,096 | 4/1967 | Carlson et al. | 317—235 |

OTHER REFERENCES

Semiconductor Products, "Microelectronics" by Hamlin, December 1962, pp. 29–32.

JOHN W. HUCKERT, *Primary Examiner.*

JERRY D. CRAIG, *Assistant Examiner.*

U.S. Cl. X.R.

307—304